US008892791B2

(12) United States Patent
McKim, Jr. et al.

(10) Patent No.: US 8,892,791 B2
(45) Date of Patent: Nov. 18, 2014

(54) COMMUNICATIONS SYSTEM FOR IMPLEMENTATION OF SYNCHRONOUS, MULTICHANNEL, GALVANICALLY ISOLATED INSTRUMENTATION DEVICES

(75) Inventors: James P. McKim, Jr., Blairstown, NJ (US); John W. Hyde, Morris Plains, NJ (US); Marko Vulovic, Hackettstown, NJ (US); Buck H. Chan, Budd Lake, NJ (US); John F. Kenny, Califon, NJ (US); Richard A. Carlson, Newton, NJ (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1827 days.

(21) Appl. No.: 11/873,429

(22) Filed: Oct. 17, 2007

(65) Prior Publication Data

US 2008/0163000 A1 Jul. 3, 2008

Related U.S. Application Data

(63) Continuation-in-part of application No. 10/857,134, filed on May 28, 2004, now Pat. No. 7,302,282.

(60) Provisional application No. 60/527,141, filed on Dec. 5, 2003.

(51) Int. Cl.
*G06F 3/00* (2006.01)
*G06F 11/273* (2006.01)
*G01R 31/3185* (2006.01)
*G06F 5/00* (2006.01)
*H04J 3/06* (2006.01)
*H04L 7/00* (2006.01)

(52) U.S. Cl.
CPC ...... *G01R 31/318594* (2013.01); *G06F 11/273* (2013.01); *H04J 3/0697* (2013.01); *H04L 7/0008* (2013.01)
USPC .................................. 710/34; 710/33; 710/61

(58) Field of Classification Search
USPC ............................................................ 710/34
See application file for complete search history.

(56) References Cited

U.S. PATENT DOCUMENTS 4,165,850 A * 8/1979 Dubreucq ................. 246/182 B
4,661,914 A * 4/1987 Mulokey et al. ............... 700/296
4,909,435 A * 3/1990 Kidouchi et al. .......... 236/12.12
5,321,597 A 6/1994 Alacoque
(Continued)

FOREIGN PATENT DOCUMENTS

EP  0 754 991     7/1996
EP  0884599       12/1998
EP  1762942       3/2007

OTHER PUBLICATIONS

European Search Report dated Jan. 16, 2009.

(Continued)

*Primary Examiner* — Henry Tsai
*Assistant Examiner* — Dean Phan

(57) ABSTRACT

An apparatus and method for synchronous communications using a serial data stream employs a housing with a controller and a back plane. The housing accepts one or more modules for interconnection with the back plane. The back plane distributes power to the modules and provides a communication link from the controller to each module. Each communication link includes a data out line, a data in line and a clock line, where each clock line is derived from one clock source.

19 Claims, 12 Drawing Sheets

(56) References Cited

U.S. PATENT DOCUMENTS

| | | |
|---|---|---|
| 5,503,026 A | 4/1996 | Bohm et al. |
| 5,640,521 A | 6/1997 | Whetsel |
| 6,037,857 A | 3/2000 | Behrens et al. |
| 6,154,683 A | 11/2000 | Kessler et al. |
| 6,233,045 B1 * | 5/2001 | Suni et al. ............... 356/28.5 |
| 6,457,152 B1 | 9/2002 | Paley et al. |
| 6,467,003 B1 | 10/2002 | Doerenberg et al. |
| 6,499,067 B1 * | 12/2002 | Honda ............................ 710/5 |
| 6,781,861 B2 * | 8/2004 | Gomm et al. ................ 365/144 |
| 7,135,899 B1 | 11/2006 | Sancheti et al. |
| 2002/0087278 A1 * | 7/2002 | Odaohhara .................... 702/63 |
| 2003/0123046 A1 * | 7/2003 | Heaton ........................ 356/27 |
| 2004/0042504 A1 | 3/2004 | Khoury, Jr. et al. |
| 2005/0125709 A1 | 6/2005 | McKim, Jr. et al. |

OTHER PUBLICATIONS

European Search Report dated Jan. 30, 2009.

* cited by examiner

COMMUNICATIONS SYSTEM FOR IMPLEMENTATION OF SYNCHRONOUS, MULTICHANNEL, GALVANICALLY ISOLATED INSTRUMENTATION DEVICES

RELATED APPLICATIONS

The present application is a continuation-in-part (CIP) of U.S. Utility patent application Ser. No. 10/857,134, filed on May 28, 2004 now U.S. Pat. No. 7,302,282, entitled "Improved Communications System for Implementation of Synchronous, Multichannel, Galvanically Isolated Instrumentation Devices, which is entirely incorporated herein by reference, and which claims priority to U.S. Provisional Application Ser. No. 60/527,141 filed Dec. 5, 2003 and entitled "Architecture and Backplane Optimized for Implementation of Synchronous, Multi-channel, Moderate Bandwidth, Galvanically Isolated Instrumentation Devices".

BACKGROUND

Modular instrumentation permits cost effective configuration of instrumentation according to specific needs and applications. There are different types of systems that provide modular instrumentation including VXI, PCI and numerous proprietary systems. Modular instrumentation typically is made up of a card cage housing and back plane with a controller. Instrumentation modules fit into the housing, interconnect with the back plane, and communicate with the controller.

In certain situations, it is desirable that modules be synchronized with each other so that operations performed in one module may be related to operations performed in another module. Such synchronization provides significant additional capability in the system as a whole. In some cases, however, tight synchronization is achieved at the expense of galvanic isolation between modules. Isolation is desirable because energy from one module can couple into another resulting in compromised performance and erroneous or improper operating behaviors.

There is a need, therefore, for a modular instrumentation system with modules that are galvanically isolated from each other while still having intermodule synchronization capability.

BRIEF DESCRIPTION OF THE DRAWINGS

An understanding of the present invention can be gained from the following detailed description of the invention, taken in conjunction with the accompanying drawings of which.

DETAILED DESCRIPTION

Figure 1:
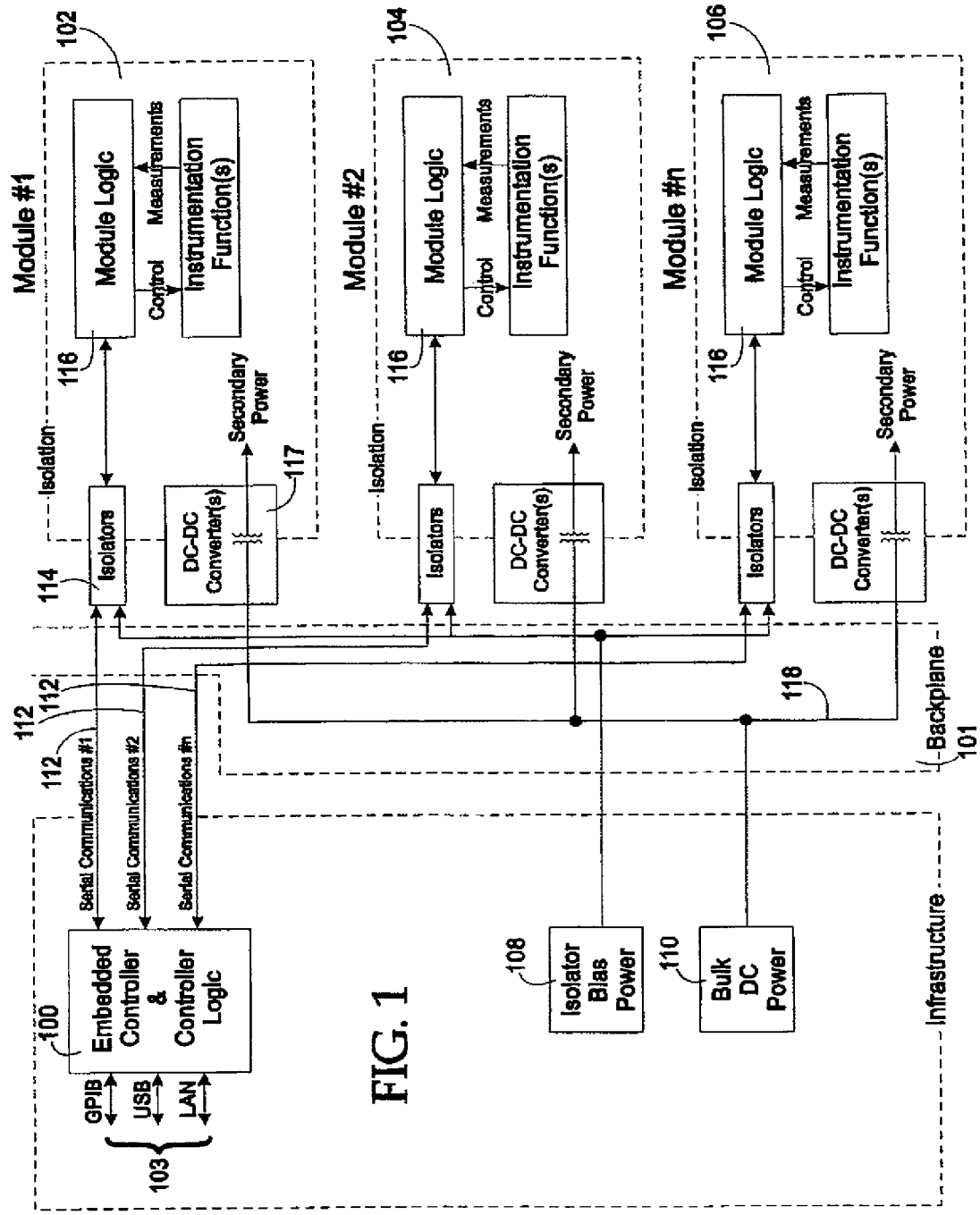
FIG. 1 is a block diagram of a back plane of a card cage according to the present teachings showing power distribution, communications links and intermodule galvanic isolation.

Reference will now be made in detail to the present invention, examples of which are illustrated in the accompanying drawings, wherein like reference numerals refer to like elements throughout. In general, the present invention comprises an architecture and backplane, which may, in turn, be comprised of a physical layer, various serial communications protocols, and supporting hardware infrastructure. The detailed description which follows presents methods that may be embodied by routines and symbolic representations of operations of data bits within a computer readable medium, associated processors, power supplies, communication busses, general purpose computers configured with data acquisition cards and the like. The architecture, backplane, serial communications protocols, and supporting hardware provides a combination of features and attributes that facilitate implementation of feature-rich, high performance multi-channel systems programmable power supplies. These features and attributes may also be beneficially applied to other classes of instruments such as waveform digitizers, voltmeters, signal generators, signal analyzers, and other instrumentation that can benefit from time synchronous generation and capture of signals on multiple channels with high galvanic isolation. The multiple channels envisioned may be of like kind, e.g. multiple channels of systems programmable power supplies, or different kind, e.g. mixed channels of power supplies, electronic loads, waveform digitizers, and synthesized signal generators. As used herein, the term "backplane" may refer to any group of conductors capable of implementing the communications system and power distribution described herein. While a specific embodiment of a backplane as described herein comprises a collection of traces on a printed circuit board, the backplane may also be implemented as a multiconductor cable, multiple cables, and/or a series of wires interconnecting devices for purposes of communication and/or power distribution. Such a backplane might also be implemented by means of optical signals, for example, by fiber-optic cables interfaced to appropriate optical transmitters and receivers.

With respect to any software described herein, those of ordinary skill in the art will recognize that there exists a variety of platforms and languages for creating software for performing the procedures outlined herein. The preferred embodiment of the present invention can be implemented using any of a number of varieties of C, however, those of ordinary skill in the art also recognize that the choice of the exact platform and language is often dictated by the specifics of the actual system constructed, such that what may work for one type of system may not be efficient on another system. It should also be understood that the routines and calculations describe in this invention are not limited to being executed as software on a computer or Digital Signal Processor (DSP), but can also be implemented in a hardware processor. For example, the routines and calculations could be implemented with Hardware Description Language (HDL) in an ASIC or in a Field Programmable Gate Array (FPGA).

With specific reference to FIG. 1 of the drawings, there is shown a ground-referenced controller 100, first, second and $n^{th}$ modules 102, 104, 106, an isolator bias power source 108, and bulk power source 110. Bulk power as used herein refers to a source of power for a distributed power architecture wherein one or more power sources provides power for a plurality of power points of load. In an alternative embodiment, the bulk power may also supply the isolator bias power. A housing (not shown) holds the controller and modules as a single physical unit that may be rack mounted into a larger test system. The housing also includes a backplane 101. Additional modules may be added to the housing depending upon the particular embodiment of the housing, backplane 101, and supporting infrastructure of the specific embodiment. The modules 102, 104, 106 may be any combination of one or more programmable power supplies, waveform digitizers, voltmeters, signal generators, signal analyzers or other single or multi-channel instruments. In a specific embodiment, at least one of the modules that populates the housing is a power supply module. The power supply module includes first and second waveform generators for control of a power supply output voltage and current and first and second digitizers for measurement of the power supply output voltage and current. In another embodiment, at least one of the modules that populates the housing is a electronic load module to sink power sourced from an external device.

The controller 100 has an embedded microprocessor and logic circuits for performing controller operations that are more fully described below. The controller 100 also has GPIB, USB and LAN interfaces 103 for optional communication between the modular system and a computer or other external hardware. Those of ordinary skill in the art will recognize that other standardized communications interfaces such as RS-232 or IEEE-1394/Firewire might be optionally provided. Proprietary and nonstandardized communications interfaces are also contemplated. Further, while it is architecturally convenient for controller 100 to be ground-referenced, it will be recognized that alternate embodiments might insert another galvanic isolation barrier between controller 100 and interfaces 103 thereby allowing controller 100 to "float" with respect to grounded external devices connected to interfaces 103 and by so doing provide means for interrupting ground currents that might otherwise flow between controller 100 and these external devices. Still another embodiment might retain the ground referencing of controller 100 while isolation within interfaces 103 is provided to allow external devices to "float". The LAN interface described provides isolation of external devices in exactly this manner. A serial communications link 112 connects each module 102, 104, 106 to the controller 100 through a communications link isolator 114 disposed on each module 102, 104, 106. The communications link isolators 114 may be any conventional and appropriate isolator familiar to those in the art and in a specific embodiment comprises a magnetically-coupled isolator, but may also include an opto-coupler, a pulse transformer, or a capacitively coupled device. On a module side of the isolator 114, the communications link 112 is connected to module side logic 116 for intelligent communication between the controller 100 and the modules 102, 104, 106. The module side logic 116 also controls specific module functions and returns status and measurement information to the controller 100. The isolator bias power source 108 is distributed to each module 102, -106 via an isolator bias bus on the back plane 101. Power from the bulk power source 110 is distributed over a bulk power bus 118 that is also part of the housing back plane 101 and is connected to each module 102, 104, 106 through transformer-isolated DC-DC type power converters 117. In a preferred embodiment, galvanically isolated bulk power DC-DC converters 117 are comprised of transformers and associated circuits that are housed within each plug-in module 102, 104, 106. Other isolation devices are acceptable depending upon the level of power to be transported across the galvanic isolation boundary. In another more specific embodiment, there is a single module that populates the housing. In this case, the single module may plug into the backplane of the housing. Alternatively, eliminating the plug-in capability can reduce a cost to manufacture the system at the expense of possible expandability and reusability of the module in another system, in which case, the "backplane" may comprise a plurality of wires to provide the communications like and power distribution. One of ordinary skill in the art will appreciate other physical implementations appropriate to realize the basic architecture described herein.

The backplane 101 comprises three distinct systems; the power distribution system, the isolator bias power distribution system, and the communications system. The power distribution system 118 is implemented in a bus configuration and may distribute AC or DC power depending upon design choice. In a specific embodiment, the power distribution system provides approximately 175 Watts of total input power at 48 VDC per module for as many as four modules. Each module is galvanically isolated from the housing in which it is held and accepts the power distribution through a DC to DC converter 117. The DC to DC converter 117 is part of the module architecture and interconnects with the power distribution system that is part of the backplane 101 through a backplane connector. In a specific embodiment, the backplane connector is a one-piece header connector consisting of a total of 26 pins on 100 mil centers. Specifically, the backplane header connector is a TSM-113-03-S-DV manufactured and sold by Samtec, Inc. A mating module receptacle is disposed on the module for direct connection to the backplane header connector and in a specific embodiment is part no. 69154-313 made by FCI/Framatome Connectors Inc. The number of pins in the backplane connector exceeds the number of signals due to aggregate current-carrying capacity limitations of the connector. There are, for example, a total of 10 pins dedicated to +48V power distribution in each module connector. Those of ordinary skill in the art will recognize that other DC voltage levels and different configurations and numbers of pins may be used in alternate embodiments. Because galvanic isolation is implemented in the modules 102, 104, 106, there is no issue with isolation or safety spacing within the backplane connector. In another embodiment not illustrated, the bulk power may be AC power distributed to each module through an AC-AC transformer or DC-AC inverter as appropriate. Because the transformer/converters are disposed on the module 102, 104, 106, it is possible for different modules to receive different types and levels of bulk power.

The isolator bias power distribution system provides power to communications system isolators disposed on each module between the backplane 101 and the communications links 112. The isolator bias power distribution system is implemented in a bus configuration. The isolator bias power distribution system provides power to the ground-referenced portion of isolators 114 disposed between the backplane 101 and the communications link 112. Module referenced portions of isolators 114 receive bias power from power supplies that are derived from the module side of the bulk power converters 117.

Figure 2:
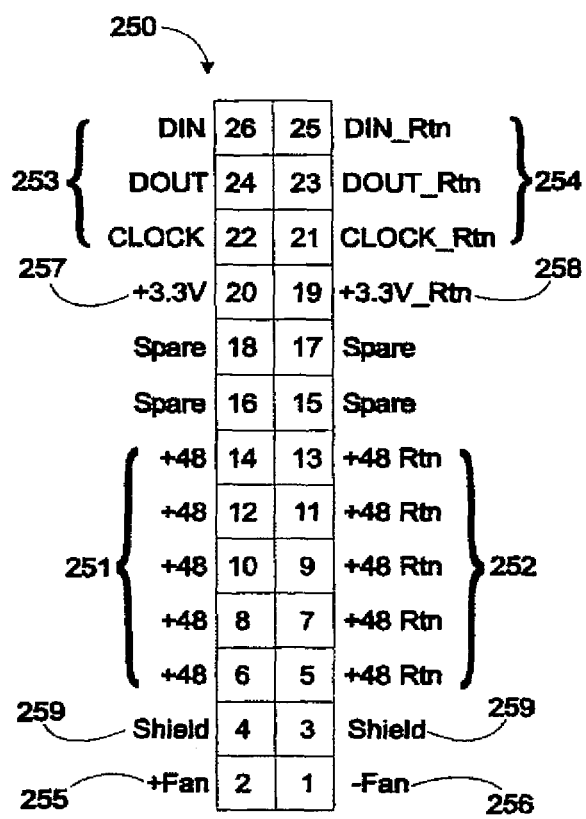
FIG. 2 is a representation of a pin out for each module receptacle according to the present teachings.

With specific reference to FIG. 2 of the drawings, there is shown a pin out of a specific embodiment of a module receptacle 250 for mating with a backplane connector according to the present teachings in which five (5) of the connector receptacles are power receptacles 251 dedicated to distribution of the 48 volt bulk power and five (5) of the connector receptacles are power return receptacles 252 dedicated to a return path for the bulk power. Three (3) of the connector receptacles are communications link receptacles 253 and another three (3) of the connector receptacles are communication link returns 254. Also present in the module receptacle 250 is a fan power receptacle 255 and fan power return receptacle 256, an isolator bias power 257 and an isolator bias power return receptacle 258, and two shield receptacles 259. As one of ordinary skill in the art appreciates, there are many possible pin outs for the module connector and receptacles 250 that are consistent with the present teachings depending upon the number of modules and power requirements of the overall system.

Figure 3:
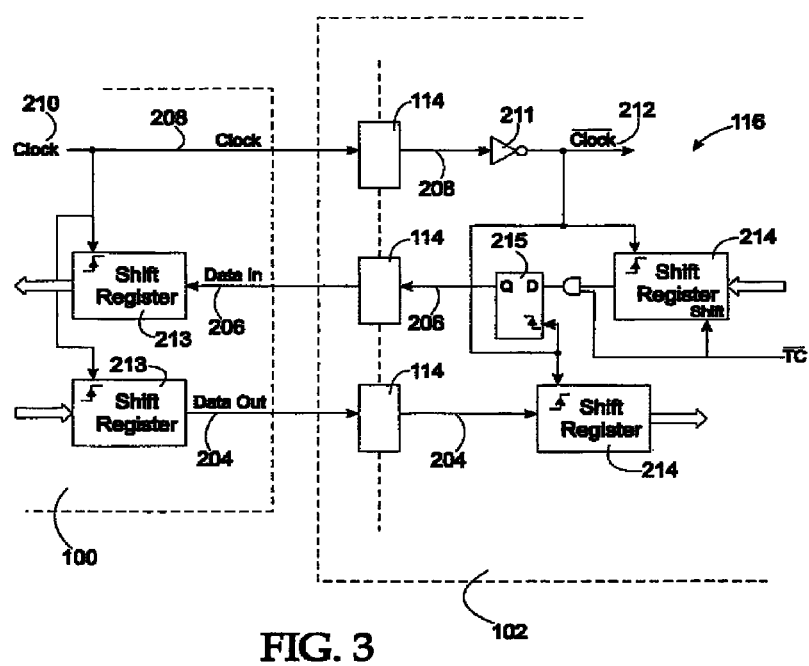
FIG. 3 view of a three-line communication link between the controller and a single module.

With specific reference to FIG. 3 of the drawings, there is shown a block diagram of the three-line serial communications link 112 between each module 102, 104, 106 and the controller 100. Each communications link 112 provides the communication infrastructure from controller side logic 100 and module side logic 116. The three-line serial communications system comprises a configuration wherein there is a dedicated communications link between the controller 100 and each one of the destination modules 102, 104, 106. As mentioned more generally in previous paragraphs, each line of the communications link 112 is galvanically isolated from the backplane connector and backplane 101. Each serial communications link 112 comprises a data out line 204, a data in line 206, and a clock line 208. Each clock line 208 is derived from a common clock source 210 and carries a clock signal that interconnects the controller 100 to the modules 102, 104, 106. Each clock signal is independent of all other clock signals, but all clock signals are derived from the same clock source 210 in the controller 100 to provide synchronous operation between modules 102, 104, 106. The clock signal may be selectively inhibited as desired as described herein, but enabled clock signals are all synchronized to the common clock source 210. In a specific embodiment, the serial communications system employs a "high true" logic convention. A "true" is defined as a logic "1", which corresponds to a high voltage state in hardware. For example, using 3.3V logic, a logic "1" is a voltage state greater than 2.4 volts.

In a specific embodiment, the backplane 101 comprises printed traces on a printed circuit board. The data out line 204, data in line 206, and clock lines 208 are printed circuit board traces having a controlled impedance of substantially 75 ohms+/−10%. The controlled impedance traces are preferred to reliably achieve high data rate transmission over the backplane 101 and may not be necessary for an embodiment implementing a slower data rate. Signal return paths may be implemented using one or more common conductive plane layers in the printed circuit board that houses the backplane 101.

The mainframe controller 100 communicates with each module 102, 104, 106 using send data packets sent over the data out trace 204. Each module 102, 104, 106 communicates with the mainframe controller 100 using receive data packets sent over the data in trace 206. In a specific embodiment, the controller defines a communications frame every 5.12 microseconds. The mainframe controller 100 initiates transmission of one send packet at the start of each communications frame. The send packets are unique and are module dependent, but are sent to each module 102, 104, 106 at the same time and synchronized to the same clock signal. If one or more modules 102, 104, 106 generate a receive packet, it is sent to the mainframe controller 100 during the same communications frame and all modules of the 102, 104, 106 send their respective receive packets at the same time and synchronized to same clock signal. One send packet is sent to every module during each communications frame In a specific embodiment, one receive packet is sent to the mainframe controller 100 also during each communications frame, but alternate embodiments whereby receive packets are sent at some integer sub-multiple of communications frames is also within the scope of the present teachings. Send packet data bits change state on rising edges of the mainframe controller clock 208 while receive packet data bits as received within the mainframe controller logic change state on falling edges of clock 208. In a specific embodiment, the one half clock cycle timing offset is implemented by inverting the serial clock signal within the modules 102, 104, 106. With further reference to FIG. 3 of the drawings, there is shown an embodiment of logic to implement the clocking offset between the send and receive packets. The clock signal 208 from the mainframe controller 200 is inverted on the module side at 211. All module communications logic uses the resulting inverted clock signal 212. The controller side clock signal 208 clocks controller side shift registers 213 to send and receive individual bits that make up the send and receive packets. Similarly, the inverted clock signal 212 on the module side, clocks module side shift registers 214 to receive and send individual bits that make up the receive and send data packets. Accordingly, data on the module side is clocked on the rising edge of the inverted clock 212 and the falling edge of the mainframe controller clock 208.

Each send and receive packet has a fixed bit length. Subject to certain constraints regarding the data field structure of the packet, data contents of each send packet is typically unique for each module. One type of exception to this general rule is instances where triggering signals or commands are sent in parallel to multiple modules to achieve tightly synchronized actions in the multiple modules. In a specific embodiment, each module 102, 104, 106 may operate independently of other modules, but a subset or all of the multiple modules may also operate in a tightly synchronized manner, at the system user's choice, without performance compromises.

Each module communicates with the controller using the data in trace 206 with receive data packets. Logic within each module initiates transmission of one receive data packet during the same communications frame. The receive packet data contents will also normally be unique for each module, again subject to certain constraints regarding the field structure. Accordingly, the controller receives one receive data packet for each module to which it is communicating in a system during each communications frame. The receive data packet is delayed in time by two serial clock periods relative to the start of the send data packet. Each send and receive data packet is 64 bits in length. The resulting bit rate is 12.5 Mbps, full duplex (or 80 nsec/bit). In a specific embodiment, therefore, it is preferred that the data isolators 114 be rated to accommodate at least the data rates present in the system. If higher data rates are desired, faster data isolation devices may be used. Send packet data bits change state on the rising edges of the clock while receive packet data bits change state on falling edges of the clock. The one-half clock cycle timing may be implemented by inverting the clock signal in logic disposed within the modules 102, 104, 106. A specific embodiment of the communications system logic employs a high true logic convention. A "true" state defined as a logic "1" corresponds to a high voltage state in the hardware. For example, V>2.4V for 3.3V logic devices.

Figure 4:
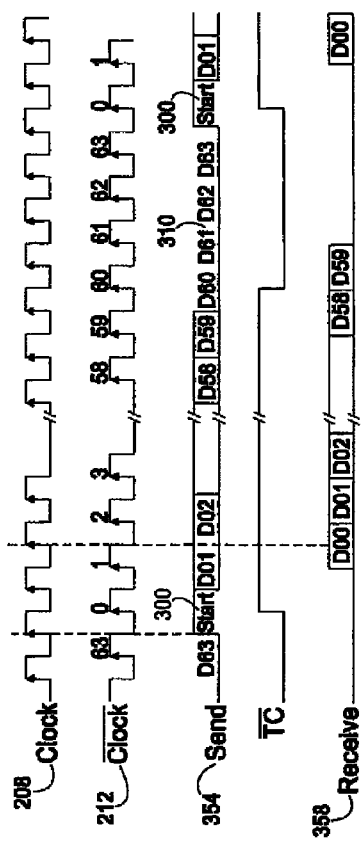
FIG. 4 shows a relative timing diagram between the clock, frame synchronization, and the send and receive packets wherein a "controller-centric" convention is adopted such that the controller "sends" data to modules and "receives" data from modules.

With specific reference to FIGS. 3 and 4 of the drawings, there is shown a timing diagram for the send and receive packets. Arrows shown in the timing diagram of the clock 208 indicates rising edges of the master clock and the arrows shown in the timing diagram for the inverted clock 212 indicate rising edges of the complement of the clock 208, which coincide with falling edges of the mainframe clock 208. The controller 100 initiates a send packet 354 with a start of frame bit 300 as a logic "1" on the rising edge of the controller clock 208. The module side logic 102 recognizes the start of frame bit 300 at the rising edge of the inverted clock 208, which is half a cycle later in time relative to the rising edge of the clock 208. A delay element 215 inserts a one (1) cycle delay of the inverted clock 208 and at the next rising edge of the inverted clock 212, a first bit of the receive packet 358 is presented onto the data in trace 206. The next rising edge of the clock 208 then latches the receive packet bit into a receive packet shift register 213, which is two full cycles of the mainframe controller clock 208 after the start of frame 300 in the send packet 354. Accordingly, the send and receive packets 354, 358 are synchronized to the same clock signal 208 and delayed in time relative to each other two complete cycles of the mainframe clock 208.

With respect to timing offsets described herein, those of ordinary skill in the art will recognize that there exists a variety of means by which the time offsets may be obtained. Moreover, it will also be recognized that propagation delays in the serial communications path, particularly those associated with isolators 114, may vary depending upon the particular embodiment. It follows, therefore, that the selection of active clock edges and deliberate insertion of delay elements may be changed to achieve the time offsets described herein or to achieve other time offsets deemed appropriate for the specific embodiment.

Figure 5:
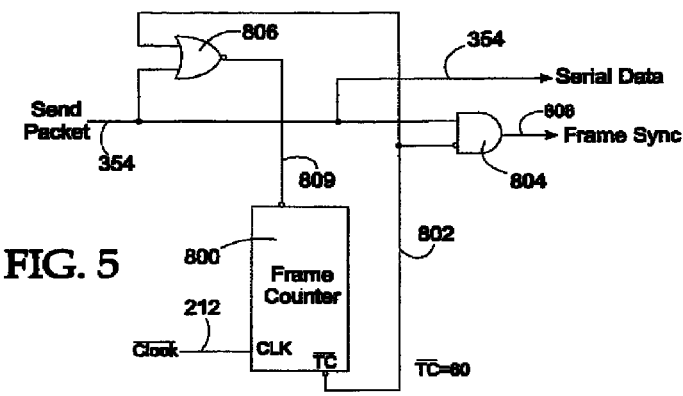
FIG. 5 shows a frame synchronization circuit.
Figure 6:
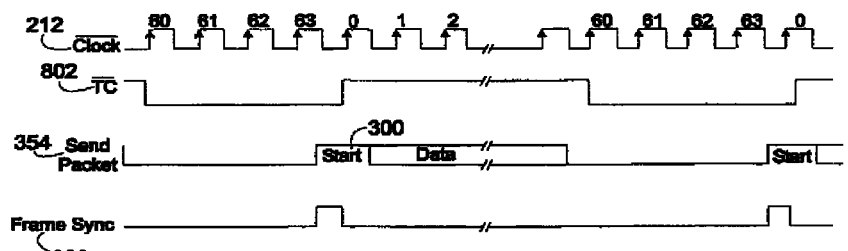
FIG. 6 is a frame resynchronization timing diagram.

The mainframe controller 100 ends the send packet with a 4-bit resynchronization interval 310, before initiating the next send packet 354 with another start of frame bit 300. With specific reference to FIGS. 5 and 6 of the drawings, there is shown logic and timing diagrams used for communications frame re-synchronization. This logic is disposed in each module 102, 104, 106 and provides synchronization between the mainframe controller 100 send data packets 354 and the modules 102, 104, 106 receive data packets 358. The mechanism relies on the fact that the overall frame period, the period of time between successive send packets 354, is at least one clock period longer than the frame data period, the period of time in which the send packet contains relevant data content. In a specific embodiment, the frame data period is 60 bits total, and four (4) bits less than the communications frame period, which is 64 bits total, the additional four (4) bits being the frame re-synchronization interval 310. The frame synchronization circuit produces a frame synchronization pulse 808 having a rising edge at the start of frame bit 300. A frame counter 800 receives the inverted clock 212. Upon reaching a terminal count of 60, the frame counter 800 sets a terminal count signal 802, which is fed back into a count enable OR gate 806. The send data packet 354 is also an input into the count enable OR gate 806. Accordingly, during the frame resynchronization interval 310, the send data packet is all logic zeros, and the output of the count enable OR gate 806 disables further counting of the frame counter 800. With the terminal count signal 802 low, the frame synchronization logic gate 804 is enabled to detect the next incoming logical "1" in the send packet 354, which is interpreted as the start of frame bit 300, setting the frame synchronization signal 808 to a logic "1". Additionally, the start of frame bit 300 in the send packet also results in a logic "1" at the output of the count enable gate 806 to be asserted. At this time, the frame counter 800 "rolls over" to a count state of 0, initiates a new count, and the terminal count signal 802 is de-asserted permitting the frame counter 800 to count edges of the inverted clock 212 until the next frame resynchronization interval 310. Identical circuits in each module 102, 104, 106, therefore, respond in parallel to the start of frame bits 300 transmitted by the mainframe controller 100 in parallel to each module 102, 104, 106. In some cases, it may be desired that a module trigger from some bit in the send data packet 354 that is not the start of frame bit 300, but some other bit. In this case, the frame synchronization signal 808 may used in conjunction with a decode circuit (not shown) that identifies a specific count of the frame counter 800 after the start of frame bit 300. This advantageously permits synchronization to the start of frame bit 300 while also providing flexibility to actually trigger at any point within the send data packet 354.

Although not required in all embodiments according to the present teachings, in a specific embodiment, all modules 102, 104, 106 communicate at the same data rate regardless of the data rate used for logic internal to the module 102, 104, 106. Lower module data rates may arise because there is not a requirement for higher data rates or because performance limitations are imposed by a particular module implementation requiring use of data rates less than the full frame rate. For example, receive data packets 358 may be populated with information content only in every fourth frame if the capability of the logic subsystem of a particular module imposes practical constraints on the module's ability to generate and transmit data. Similarly, design or definitional details for a particular module may lead to implementation of lower or variable data rates. Receive data packets 358 without information content in specific fields are received by the controller 200 and these may be ignored by higher level functions operating upon data within those fields. It is also possible to employ embodiments of modules with different frame rates for different classes of module. In such an embodiment, it is beneficial, but not necessary that the slower frame rates be integer sub-multiples of the controller communications frame rate.

The controller communications frame rate establishes a maximum synchronous measurement digitization rate or digital synthesis rate without data buffering provided in the module 102, 104, 106. For purposes of explanation through illustration, three modules having two measurement data sources each, providing 200 k data points per second with conversion resolutions of 18 bits or less for each source may be supported without local buffering. Higher resolution conversions or faster conversions may be supported without local buffering if only one data source is used. Higher effective conversion rates or additional simultaneous sources may be supported for lower conversion resolutions by packing return data words from multiple sources into each of two 18 bit synchronous measurement receive data fields defined for receive data packets 358. Within the limitations imposed by the bit rate, the synchronous data field sizes and possible utilization of associated reserved fields, a variety of options exist for managing transmission of data to or from multiple sources at various conversion rates.

Figure 7:
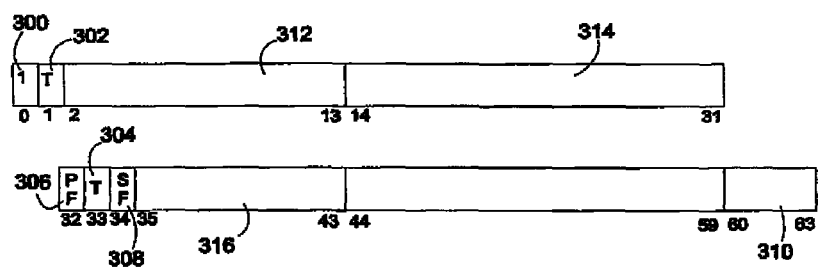
FIG. 7 shows a send packet field structure, the term "send" again representing a "controller-centric" perspective wherein data is "sent" from the controller to modules.

With specific reference to FIG. 7 of the drawings, there is shown a diagram of data field definitions within a send packet 354 data structure. In a specific embodiment, the send data packet 354 contains a total of 60 bits representing asynchronous commands, data and trigger bits. In addition to the 60 send packet bits, there are an additional four (4) bits 310 used for assuring re-synchronization of all of the modules 102, 104, 106 to the same clock edge 300 as described herein. Common to all send packets 354 is the start of frame bit 300 in the bit 0 position. In a specific embodiment, the start of frame bit 300 is set to a logic "1" to re-establish synchronization between the controller 100 and the module 102, 104, or 106 to which the send packet is directed. The re-synchronization period 310 ensures that all module side logic systems respond to the same clock edge when recognizing the beginning of a serial communications frame. This mechanism in turn ensures that synchronization granularity is related to the serial clock period, which in a specific embodiment is 80 nsec, rather than to the frame period, which in a specific embodiment is 5.12 us. Synchronization to a specific clock edge is established at system power-up and subsequently maintained without interruption until such time as the system is powered-down. During normal operation, the four frame resynchronization bits 310 are not necessary, but they do provide a margin of error that permits resynchronization at each start of frame bit 300 should unexpected errors occur that affect frame synchronization. However, the frame synchronization logic common to all module side logic systems provides a means not only for establishing synchronization of the modules 102, 104, 106 at power-up, but also for re-establishing common frame synchronization to a single clock edge in all module side logic systems when needed. Frame synchronization is achieved by having the serial data out circuitry within logic block 200 force serial data signals on the data out trace 204 for all modules 102, 104, 106 to a "low" state for a time known to be greater than the length of relevant data in send packets 354. In this manner, each module's frame synchronization circuit (shown in FIG. 5 and described herein) will have reached its "terminal count" state and will therefore be ready to synchronously detect a clock edge of the start of frame bit 300 that is transmitted to all modules 102, 104, and 106, simultaneously at the beginning of a new serial communication frame.

Also common to all send packets 354 is first and second controller trigger bit fields 302, 304 in bit 1 and bit 33 positions, respectively, of the send packet 354. Each trigger bit 1, 33 is positioned in the send packet 354 to transmit triggers detected by the controller 100 to relevant modules 102, 104 and/or 106 with a maximum uncertainty of half the communication frame interval, which is 2.56 usec in the specific embodiment. Although the trigger delay uncertainty is equal to one-half of the frame period, triggers sent to multiple modules 102, 104, 106 in parallel within the same frame period and within the same trigger bit position in the frame are synchronized to each other within 80 ns or less.

A power fault bit 306 is positioned at bit 32, and the system fault bit 308 is positioned at bit 34. All remaining bit positions are module specific, that is to say, defined based upon the module receiving the particular send packet, although certain modules may define certain bit positions similarly in a specific embodiment. In a specific implementation, bits 2-13 represent an address/command field 312, bits 14-31 represent a data field 314, bits 35-43 are for module specific functions 316, and bits 44-59 are reserved for data wherein the timing of its transmission is coupled to the timing of the serial communications frame Illustrative examples of data having the timing of its transmission coupled to the serial communications frame are waveform digitization or synthesis where is it desirable to have a defined sample rate (sampling clock) which is derived from a high quality clock source. In a specific embodiment, the sampling clock source is the start of frame bit 300 or one or both of the first and second controller trigger bits 302, 304 or some other signal derived from and synchronized to the start of frame bit 300. If there is no information content for populating one or more of the various fields, a specific embodiment assigns zeros to bit positions within those fields, for example, to represent a no operations (NOP) command for the command field 312.

A position of the trigger bits within the send packet 354 and the clock rate determine trigger timing characteristics such as latency and jitter. In a specific embodiment, trigger latency is approximately 2.56 usec maximum for a 5.12 usec frame rate for the disclosed bit definitions and the trigger bit positions within the send packet 354. Jitter for multiple triggering events is also approximately 2.56 usec. Various secondary influences such as accuracy tolerances on the clock as well as minor contributions from logic timing delays and propagation delay induced skews will affect the actual trigger latency and jitter from packet to packet. Accordingly, trigger latency will be 2.56 usec worst case assuming zero logic delays, ideal clock accuracy, and no skew. Specifically, additional delays and/or jitter may be incurred in the controller 100 or module 102, 104, 106. For example, there are likely to be hardware delays that are incurred between recognition of an external trigger event by the controller 100 and subsequent transmission of trigger bits 302 or 304 to one or more of the modules 102, 104, 106. Further delays and/or jitter may be incurred within the logic 202 employed in the module 102, 104, 106. The 2.56 usec example, therefore, is the worst-case influence of the communications system and the best case possible for the system as a whole. It is also possible to treat the two trigger fields as separate and distinct triggers in which case, the trigger latency and delay is the value of the serial communication frame or twice the values achieved by treating the two fields as a common trigger source for operations within the module logic function.

Events that are synchronized to the start of frame bit 300, or to arbitrary bit positions within the send packet 354 may have better timing and jitter properties than the trigger bits. As an example, analog to digital sampling and conversion may be synchronized to the start of frame bit 300 to yield sample to sample timing jitter of less than 80 nsec. Embodiments employing data rates higher than 5.12 usec may achieve even lower values for timing jitter. For example, less than 40 nsec for a clock source of 25 MHz. These lower values of jitter with respect to an individual module or between multiple modules may be achieved for triggering events by storing the receipt of trigger within module logic and then transmitting the trigger synchronously with a defined packet event such as the frame synchronization bit 300.

Figure 15:
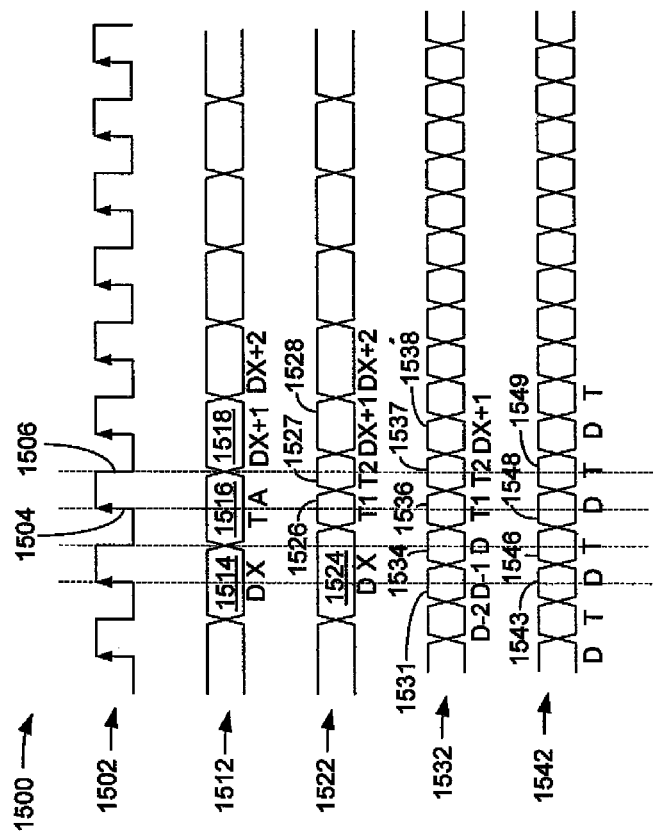
FIG. 15 is a timing diagram showing an alternative embodiment of implementing trigger fields in a send packet structure.

FIG. 15 shows alternative embodiments of the trigger bit described above relative to a timing diagram that generally corresponds to the data field definitions within the send packet data structure shown in FIG. 7.

A clock line 1502 is similar to the clock line 208 described above. The clock line 1502 illustrates the clock signal generated by the controller 100 as described above.

FIG. 15 describes a number of embodiments of applying double data rate (DDR) techniques to the serial communications protocol described above with respect to serial communications link 112 (FIG. 1). As will be described below, applying DDR techniques to the serial communications link 112 allows additional trigger bits to be generated, allows additional data bits to be generated, allows the reduction of trigger latency, and allows various combinations of these.

The clock line 1502 and the data line 1512 are shown in an idealized form as described above. The data line 1512 is a simplified depiction of the send data packet shown in FIG. 7, and shows the timing of the trigger bit fields, an exemplary one of which is shown at 1516, and data bit fields, exemplary ones of which are shown at 1514 and 1518. The data is transmitted with bit periods equal to the clock period, but time shifted so that positive-going transitions of the clock line 1502 are centered in the bit period at the receiver, as described above. For purposes of illustration, a single reserved trigger bit field 1516, designated "Trigger A" or "TA" is shown in FIG. 15. A trigger bit may or may not be present in this field. In the example described above, two such reserved fields (Trigger A, 302 in bit position 1 in FIG. 7, and Trigger B 304 in bit position 33 in FIG. 7) are provided in the send data packet for each serial communications frame.

An example of doubling the frequency of the trigger bit field is shown by the data line 1522. The data line 1522 shows an example where the data out bit period is halved (doubled in frequency) for at least one clock period so that two trigger bit periods, or fields, referred to as "Trigger 1" or "T1" 1526 and "Trigger 2" or "T2" 1527 may be sent during one period of the clock line 1502. The trigger period 1526 is detected as described above on the positive-going transition 1504 of the clock line 1502 and the trigger period 1527 is detected on the negative-going transition 1506 of the clock line 1502. The period of the data bits in data period 1524 just before and data period 1528 just after the trigger fields 1526 and 1527 are altered to maintain the prior timing relationship for the remaining data bit fields in the serial communications frame. In this example, the data period 1524 is lengthened and the data period 1528 is shortened. However, in an alternative embodiment, the data period 1524 can be shortened and the data period 1528 can be lengthened.

Providing two trigger bit fields 1526 and 1527 in place of a single trigger bit field provides the advantage of providing an additional trigger bit without otherwise changing the serial communications clock frequency or the period of overall serial communications frame. Further, the Trigger B 304 in bit position 33 in FIG. 7 can be similarly doubled in frequency. In the context of the embodiment described above in FIG. 7, two additional trigger fields are provided, thus providing a total of four available reserved trigger bit fields per serial communications frame.

An example of doubling the frequency of the trigger bit field and the data bit field is shown by the data line 1532. The data line 1532 shows an alternative embodiment in which the entire data out stream is transmitted at twice the clock frequency shown in clock line 1502. As shown by the data line 1532, two of the bit periods are reserved for trigger bits, shown as exemplary trigger bit fields 1536 and 1537, while the data out periods of the remainder of the fields are halved, effectively doubling the frequency of the data fields. Exemplary data fields having double frequency are illustrated at 1531, 1534, and 1538. Alternate data/trigger bits are successively detected on alternating positive-going and negative-going transitions of the clock line 1502. As described with respect to data line 1522, the basic clock frequency is not changed nor is the period of the serial communications frame. This technique provides the advantage of doubling the number of available trigger bits while also doubling the number of available data bits.

An example of doubling the frequency of the trigger bit field and the data bit field, and implementing alternating interleaved trigger and data bit fields is shown by the data line 1542. In the example shown in the data line 1542, exemplary trigger bit fields are shown at 1546 and 1549 and exemplary data bit fields are shown at 1543 and 1548. In this example, fewer data bits are available than described in date line 1532, but much lower trigger latency is obtained because any of the available trigger fields may be used to transmit a trigger event. Compared to the architecture described above, the data line 1542 retains the same number of data bits, but lowers the trigger latency by a factor of 32 in this embodiment.

Specific reference is now made to the power fault bit 306 shown in FIG. 7 of the drawings. When the controller 100 detects a power fault condition on the bulk power system 110, it sets the power fault bit 306 to a logic "1" in the next send packet 354. The modules 102, 104, 106 initiate an appropriate power fault response upon receipt of the power fault bit 306 in the send packet 354. The power fault bit 306 remains true unless and until the bulk power distribution system returns to normal operating boundaries.

Specific reference is made to the system fault bit 308 also shown in FIG. 7 of the drawings. The system fault bit 308 is set when a system wide response is appropriate. In a specific application of the present teachings, if one of the modules detects a fault that warrants notification to other modules, the offending module sends an indication to the controller 100 in a receive packet 358. The controller 100 then sets the system fault bit 308 in the current send packet 354, that is to say, the send packet 354 that is sent within the same frame period and the receive packet 358 that provided the fault notification. Receipt by a module 102, 104, 106 of the system fault bit 308 in the current receive packet 358 causes the receiving module to initiate protective action. The system fault bit 308, therefore, is used to communicate detection of the fault conditions within one or more of the modules 102, 104, 106 that may require protection responses from the remaining modules 102, 104, 106. Because of the relative timing of the send and receive packets 354, 358 and the relative positioning of the salient bits in the respective packets, receipt of the fault notification and relaying of the notification occurs in a single frame. As one of ordinary skill in the art can appreciate, this permits fast system wide response to a fault detected in a single module while also providing galvanic isolation between the modules 102, 104, 106 and between the modules and the controller 100.

In a specific embodiment and with further reference to FIG. 7 of the drawings, the address/command field 312 of the send packet 354 and the data field 314 of the send packet 354 provide a mechanism for sending commands from the controller 100 to the modules 102, 104, 106. In the specific embodiment, these fields are defined as such for all modules 102, 104, 106 and a plurality of different modules use a similar subset of the same command codes. One of ordinary skill in the art, however, realizes from a fair reading of the present disclosure, that common bit positions and command codes for the address/command field 312 of the send packet 354 are not required to implement an embodiment according to the present teachings.

Figure 8:
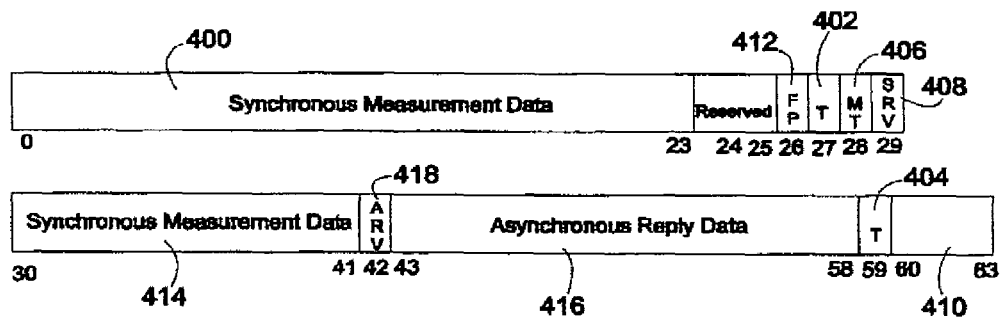
FIG. 8 shows a receive packet field structure, the term "receive" again representing a "controller-centric" perspective wherein data is "received" by the controller from modules.

With specific reference to FIG. 8 of the drawings, there is shown a diagram of a general receive data packet 358 structure. Bit position 26 of the receive packet 358 is defined as the fast protect field 412 and is related to the system fault field 308 of the send packet 354. Specifically, when the controller 100 receives a logic true value in the fast protect field 412, the controller may immediately set, to a value of "1" or a logic true, the system fault field 308 of the send packet 354 that is sent in the same frame as the receive packet 358 that contains the logic true in the fast protect field. Because the of the relative timing and skew between the send and receive packets 354, 358, the controller 100 receives the value in the fast protect field 412, before it sends the bit designated as the system fault field 308. Logic in the controller 100 is able to receive and decode the fast protect field 412 of the receive packet 358 and shift a true value into the system fault field 308 of the send packet 354 before the remainder of the send packet that includes the system fault field 308 is sent. Accordingly, a fault in any one of the modules may be detected within a period slightly longer than one frame period, 69 bit periods to be exact. Additionally, each module 102, 104, 106 may individually define one or more available states that, when detected, would set the fast protect field 412. In any specific application, a user may programmatically enable none of the available states, a subset of the available states or all of the available states to further define which of the available states would operate to set the fast protect field 412 at any time. The module may have any number of fault conditions. Logic in the module can selectively enable one or more of the fault condition status indicators. The fast protect bit field 412 reflects the logical OR-ing of any of the enabled fault conditions. Programmable gating logic within controller 100 permits selective distribution of "true" fast protect bits 412 set by one of the modules 102, 104, 106 to one or more other modules 102, 104, 106 according to the desires of the system user. Further, this gating logic allows system users to define one or more "groups" of modules that may communicate the presence of a fault condition or conditions, indicated by setting fast protect bit 412 true, to other modules within the defined group. Detection, transmission, reception, and responses to detected fault conditions may occur simultaneously in multiple groups so defined. Moreover, any module within a defined group may be the "source" of a detected fault condition or conditions while all other modules within the defined group may be the "receivers" of the indication that a fault condition requiring a response has been detected. Specifically, a user may program gating logic within the mainframe controller 100 at run time to selectively respond to a received "true" in the fast protect field 412 depending upon which module set the fast protect bit and upon which module(s) are desired to select of "receivers". In the simplest case, the controller 100 can disable all gating of the fast protect bit field from one or more of the modules 102, 104, 106. In another case, the controller 100 can enable responses to a "true" identified in the fast protect bit field 412 from a specific module by gating this bit to permit setting the system fault field 308 "true" in the next send packet 354 for some subset of the modules 102, 104, 106 present. The subset of the modules receiving the "true" system fault field 308 may be differently defined depending upon which of the modules 102, 104, or 106 set the fast protect field 412 of its receive packet 358 "true". The setting of the system fault field 308 in response to the "true" value in the fast protect field 412, provides the fastest response of one module 102, 104, or 106 to an event in another module 102, 104, or 106. As a slower alternative, the controller 100 may also respond to a "true" fast protect field 412 by issuing a specific command to one or more of the modules. Because the gating logic in controller 100 may be programmed at run time, the definitions of how the controller 100 is to respond may be changed at any time. Additionally, the modules 102, 104, 106 may be configured to respond in a number of ways to receipt of a "true" system fault field 308. In one embodiment, the receiving module may respond by taking one type of defined action such as shutting down all functions. In another embodiment, the receiving module may respond by providing some but not all of its functionality. The module response may be defined depending upon the type of module and may be programmed at the module configuration stage. Alternatively, the module may be so configured at the module configuration stage as to provide a selectable range of response characteristics from amongst which the user may optionally select at any time following configuration, that is, at run time by means of user controlled gating logic. Advantageously, these options provide the capability of soft configuration of a module and/or run time selection of module response characteristics while providing hardware-type speed of response.

Bit position 28 is defined as a measurement triggered status field 406. A logic "1" or true value in the measurement triggered status field is placed in the next receive packet after a measurement subsystem in a module is triggered and provides an indication to the controller 100 that this event has occurred. Triggered status is indicated once in a receive data packet 358 for each detected trigger event and is then cleared in the next receive packet 358 if a new trigger has not occurred. Accordingly, the measurement triggered status field 406 also provides relative timing information for data originating in the module with the measurement triggered status field 406 set. As an illustrative example, triggering events may occur autonomously within a single module, e.g. a level triggering event derived from digitized samples of output current data. Only the given module has immediate "knowledge" that such an event has occurred since the event is local to the module, yet it is often desirable to communicate the occurrence and may occasionally desirable to use it to invoke "events" elsewhere in the overall system, e.g. to mark triggering event locations within memory buffered time records of digitized data or to possibly trigger output changes in other modules 102, 104, 106. As an example of the desirability of knowing when a triggering event occurred without regard to the source of the triggering event, users of waveform digitizing instruments such as digital oscilloscopes frequently desire to observe digitized information that was obtained prior to the triggering event. It may also be desirable to view some data prior to the event and some data obtained after the event. With further reference to FIG. 8 of the drawings, bit position 29 is a receive data valid bit 408 that indicates that the current receive packet 358 contains valid synchronous measurement data. The valid data bit 408 is set true or false for every receive data packet 358 depending upon the current status of the information contained therein. In a specific embodiment, the measurement triggered status field 406 is not set true unless the valid synchronous measurement data field 408 is also set true to ensure that the controller 100 detects measurement trigger events synchronized to actual measurement events.

With specific reference to FIG. 8 of the drawings, the receive data packet 358 also comprises first and second trigger bit fields 402 and 404 in bit positions 27 and 59, respectively. The first and second module trigger bit fields permit individual modules 102, 104, 106 to send triggers to the controller 100 with a maximum delay of 2.56 usec. A selection of the bit positions for the first and second module trigger bit fields 402, 406 further permit triggers that originate in one of the modules 102, 104, 106 to be received by the controller 100 and passed along in a send packet 354 to a destination module with minimal additional delay. In the disclosed embodiment, this minimal additional delay is approximately 320 nsec or four clock periods. Programmable gating logic within controller 100 permits selective distribution of triggers originating within one module 102, 104, or 106 to one or more other modules 102, 104, 106 according to the desires of the system user. Further, this gating logic allows system users to define one or more "groups" of modules that may be enabled to respond to the triggering event originating from any module within the defined group. Detection, transmission, reception, and responses to triggers may occur simultaneously in multiple groups so defined. Moreover, any module within a defined group may be the "source" of a trigger while all other modules within the defined group may be the "receivers" of the trigger. Specifically, logic gating within the controller 100 may be programmed to respond to receipt of a set receive trigger field 402, 404, by setting the send trigger field 302 or 304 in one or more of the next send packets 354 destined for one or more selected ones of the modules 102, 104, 106. The gating logic within controller 100 may further be programmed differently depending upon which module 102, 104, or 106 set the trigger field 402, 404. As an example, receipt of a "true" receive trigger bit 402 or 404 from one specific module, 102 as an example, may cause the controller to set the send trigger bit field 302 or 304 "true" in the next send packets 354 going to one module, 106 as an example, but not another module, 104 as an example. Additionally, receipt of a "true" receive trigger bit 402 or 404 from a different specific module, 104 as an example, may cause the controller to set the send trigger bit field 302 or 304 "true" in the next send packets 354 going to two modules, 104 and 106 as an example. Accordingly, the controller's response to a "true" value in the receive trigger field 402 or 404 is selectively controlled depending upon the user's preference and needs. Different modules may be selected as "sources" and as "receivers" and these selections may be changed at any time while the system is running. Advantageously, a system so defined provides flexibility to the user while maintaining hardware speed responses and galvanic isolation between modules. Bit positions 60-63 are unused.

Figure 9:
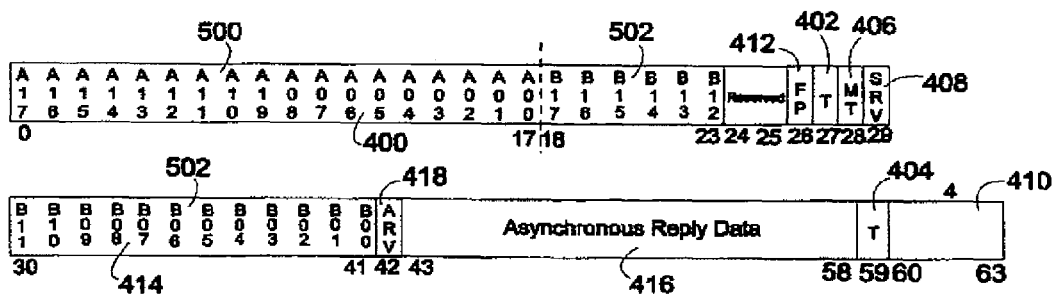
FIGS. 9 and 10 show embodiments of receive packet field structures for specific module types.
Figure 10:
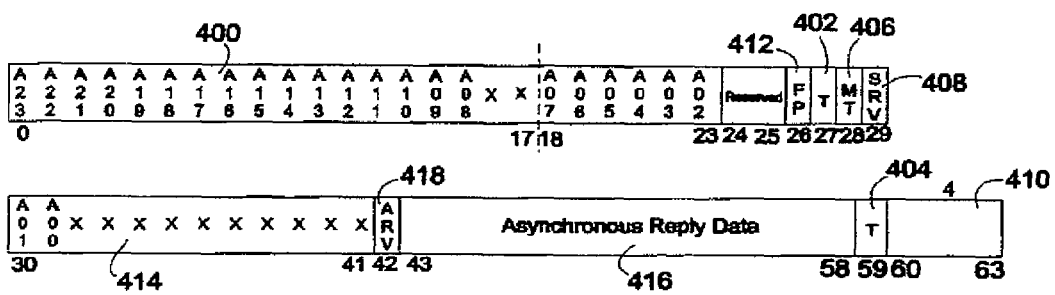

The receive data packet 358 comprises both synchronous digitized measured data as well as asynchronous query responses. In a specific embodiment and with specific reference to FIGS. 9 and 10 of the drawings, bit positions 0-23 and bit positions 30-41 comprise first and second portions of a synchronous measurement data field 400, 414, respectively. The asynchronous receive data field 416 populates bit positions 43-58. An asynchronous receive data valid field 418 in bit position 42 of the receive data packet is set to a logic "1" if an asynchronous query response is included in the receive data packet 358. Data in the asynchronous data field 416 and the asynchronous data valid field 418 are transmitted together in the same receive data packet in response to queries from the controller 100. Responses to controller queries are not typical under normal operation because controller query commands are likely to be either irregular or infrequent events. Location of asynchronous response fields near the end of the receive packet permits initiation of queries and return of corresponding responses within the same frame period. It is not necessary to practice of the present teachings, however, for return query responses to be within the same frame period as initiating queries. These responses may, in fact, be delayed by an arbitrary number of frames depending upon the response characteristics of the module in question and the particular nature of the query. In a specific embodiment, it is defined that a module eventually respond to a query and that a series of queries and responses occur in order, i.e. query 1, response 1, query 2, response 2, etc. In an alternate and more general embodiment, an order of responses to queries need not be maintained if information is encoded within the response that uniquely ties it to the particular query to which it is a response. FIG. 9 of the drawings is a diagram of an embodiment of a receive data packet structure 358 that provides two 18-bit words of digital data per packet. FIG. 10 of the drawings is a diagram of an embodiment of a receive data packet structure 358 that provides a single 24-bit word of digital data per packet. As one of ordinary skill in the art can appreciate, the receive packet shown in FIG. 10 has unused data bits that may be used in a specific embodiment.

It is possible that a given receive data packet 358 contains neither synchronous measurement data nor asynchronous query response data. In this case, neither the asynchronous receive data valid field 418 nor the receive data valid bit 408 are set true and the controller 100 may ignore these fields in the receive data packet 358. If a system has more than one module operating at data rates less than approximately 200 k words/sec, i.e. at the frame rate, it is not necessary that all active channels transmit return data simultaneously. The possibility exists regardless of whether multiple channels are operating at identical data rates or not. On the other hand, applications providing synchronized multiple channel digitization or other actions occurring simultaneously in time in multiple modules may be desired. The implementation of the communication system architecture in a star configuration having a common clock source and synchronous frames, supports generation of "events", such as triggers or commands, sent as part of send data packets, which may be used to synchronize parallel actions such as A/D sampling in multiple modules. Synchronization of parallel actions such as digitization and/or synthesis within and between multiple modules provide benefits known to one of ordinary skill in the arts of digital signal synthesis and analysis. In one embodiment, an event may comprise waveform digitization and waveform synthesis on separate channels of a module. A typical application might involve sourcing of multiple channels of dynamically variable DC power "waveforms" to a device under test (DUT) with simultaneous and synchronous multi-channel digitization of current waveforms associated with each of the sourced voltages. Many other applications are possible including without limitation, synchronous multi-channel function generation, synchronous multi-channel high speed voltmeter digitizing, and various mixes of both functions.

With specific reference to FIG. 9 of the drawings, there is shown a diagram of a specific embodiment of bit assignments for receive data packets originating from a dual channel, 18-bit module. The first and second portions of the synchronous measurement data field 400, 414 together comprise a total of 36 bits. Two 18-bit data words populate the first and second portions of the synchronous measurement data field 400, 414 where a first channel measurement data word 500 populates bit positions 0 through 17 in the first portion of the synchronous measurement data field 400 and a second channel measurement data word 502 populates bit positions 18-23 of the first portion of the synchronous measurement data field 400 and all bit positions of the second portion of the synchronous measurement data field 414. Although somewhat arbitrary and done primarily for immediate convenience, a specific embodiment positions the least significant bit in the highest bit position, because digitization is implemented using successive approximation type A/D converters. Converters of this type implement a conversion process that produces the MSB first followed by bits of lesser significance and ending with the LSB. Accordingly, it is possible to shift data out in the receive data packet 358 as it comes into the module side logic All remaining status bits and trigger bits as defined remain the same.

With specific reference to FIG. 10 of the drawings, there is shown a diagram of a specific embodiment of bit assignments for receive data packets originating from a single channel, 24-bit word module. The 24 bits sent in the receive data packet populate certain bits in the first and second portion of the synchronous measurement data field 400, 414. As one of ordinary skill in the art appreciates, the receive data packet structure supports up to a 38-bit word of digital data per receive data packet.

Although derived from a common source, each module clock signal is inverted and passed through a logic gating function within the controller side logic before launching onto the clock trace 208. This gating function permits selective inhibiting of clocks to one or more modules as needed to affect resetting and/or configuration of individual modules. In addition, at system power-up, all modules may be reset in parallel by inhibiting the clock signals in parallel. In a specific embodiment, clock signals are synchronized to within a few nanoseconds. This tight level of synchronization is possible despite individual gating due to very low logic gate delays within the device implementing the controller side logic.

The serial communications system and supporting architecture described herein provides for four (4) distinct modes of operation. The distinct modes are; (1) a normal operating mode described above, (2) a power-up and discovery mode, (3) a configuration mode, and (4) a fault detection and protection mode. The previous paragraphs detailed the normal operating mode and briefly touched on the fault detection and protection mode. The disclosed serial communications system and supporting architecture also provides automatic detection of and identification of installed modules upon power-up of the instrumentation. Detection refers to discovery that a module is physically present and identification refers to determining a specific identity and function of an installed module and determining whether the module is operational. Detection is advantageous because the system need not be fully populated with modules for proper operation. When a module is detected as present, identification permits automatic configuration and communication between the controller and the identified module prior to initiation of normal operation. The controller first responds to a power-up event (i.e. applying line power to the mainframe). When the 48 v mainframe power supply reaches a certain boundary voltage, the mainframe processor initiates a boot sequence. The boot sequence is contained in flash memory in the mainframe. Use of the flash memory advantageously permits modification of the boot sequence through soft configuration. Until the mainframe boundary voltage is reached, the processor in the mainframe is held in a reset state. As the mainframe processor boots, the power supplies to the mainframe and the dc-dc converters that supply voltages to other parts of the mainframe and to the various modules over isolation boundaries further stabilize. When the processor completes its boot process, it configures and initiates the mainframe serial communications logic and then checks a "power good" status bit that indicates that the 48 v power supply is operational within sufficiently tight tolerances. A check of the "power good" status that indicates operation within tighter tolerances than required for mainframe processor and logic operation is beneficial because a lower voltage is able to provide a functional mainframe for some period of time, but can result in an over-current situation when distributing power to the modules causing failures from over-heating.

If the mainframe "power good" status bit is determined to be true following the boot-up sequence, the processor then initiates a process to bring up each module that populates the mainframe using a process that includes an identification step followed by a configuration step. In a current embodiment, modules are configured in parallel. Alternative embodiments, however, could implement sequential module configuration. The mainframe controller first determines 1301 whether or not a module is physically present. This is implemented by means of a convention wherein an installed and unconfigured module 102, 104, 106 forces the data in line 206 to a logic "low" or "0" state. A weak pull-up resistor, 30 kohms for example, is disposed on the data in line 206 within the controller 100. The weak pull-up resistor causes a logic "hi" or "1" state unless modules 102, 104, 106 are present to force the data in line 206 to a logic "low" or "0" state. Accordingly, the controller 100 may poll available data in lines 206 at times when serial communications are not active, either for all or for selected modules, to determine the states of these lines and thus determine whether modules are present or not. In a specific embodiment, this polling process may only take place immediately following the power-up boot sequence or after a module or modules have been explicitly reset. In normal operating mode, the serial communications activity precludes a polling action. Alternative embodiments, however, could implement a system permitting the polling process at any time.

Figure 11:
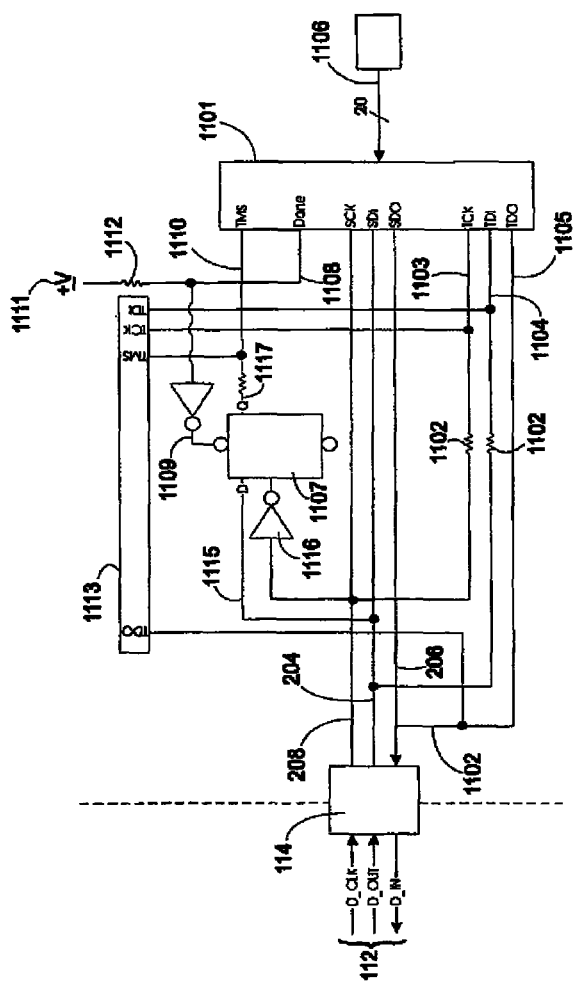
FIG. 11 shows module logic specific to soft configuration via a serial bit stream.

For each installed module, the mainframe processor determines the presence and identity of the module and then configures the module for normal operation. Just prior to entry into normal operation, actions are taken by the mainframe controller to determine if installed module(s) have properly responded to the configuration sequence. Failures may result either in flagging failed modules as inoperative or in additional attempts at configuration. With specific reference to FIG. 11 of the drawings, there is shown a simplified block diagram of logic used in module identification and configuration. FIG. 11 shows both the normal serial communications circuit and a JTAG serial interface circuit which is used to implement an alternate "boundary scan" mode of operation during module identification and configuration. Standard JTAG operation and protocols are described in IEEE Standard 1149.1-2001: IEEE Standard Test Access Port and Boundary-Scan Architecture, the contents of which are hereby incorporated by reference. In general, a JTAG boundary scan as described in the cited Standards document is a quasi-passive mode of operation whereby a first device can communicate by means of a clock signal, a control signal, and a data in signal to a second device and thereby extract, by means of a data out signal, information about the state of I/O logic and/or internal logic within the second device. The second device does not actively participate in or control the communications activity, but instead receives the clock, control input, and data input from the first device and shifts test data out in response. It is necessary only that I/O circuits and boundary scan logic within the second device are active and functional during the JTAG scan process. In the disclosed embodiment, the JTAG process is used to effect self-identification of modules and to configure or effectively program the module processor 1101. The module processor 1101 is a processing and control device that implements controller and logic functions in each module 102, 104, 106 that populates the system. In a specific embodiment, the module processor 1101 is a RAM-based field programmable gate array. Those of ordinary skill in the art will recognize that an ability to program and re-program complex logic devices in instrumentation systems provides valuable benefits and all the more so if this ability coexists with and "re-uses" hardware infrastructure necessarily present for other reasons, in this case to effect serial communications and control as described herein. For the discussion to follow, it is to be understood that the serial communications link 112 between the controller 100 and each module 102, 104, 106, consists of three signal lines while the JTAG interface port for the module processor device consists of four signal lines. A feature according to the present teachings to be described with respect to JTAG operation therefore derives in part from the means by which the three communications system signal lines 112 are used to establish communication with the module processor device JTAG port requiring four signals. Another feature according to the present teachings is the means by which the three-signal communications link 112 is sometimes operated according to one protocol and sometimes according to another, specifically to operate sometimes in "normal" communications mode as previously described herein and at other times in JTAG mode as to be described in the paragraphs following.

Figure 12:
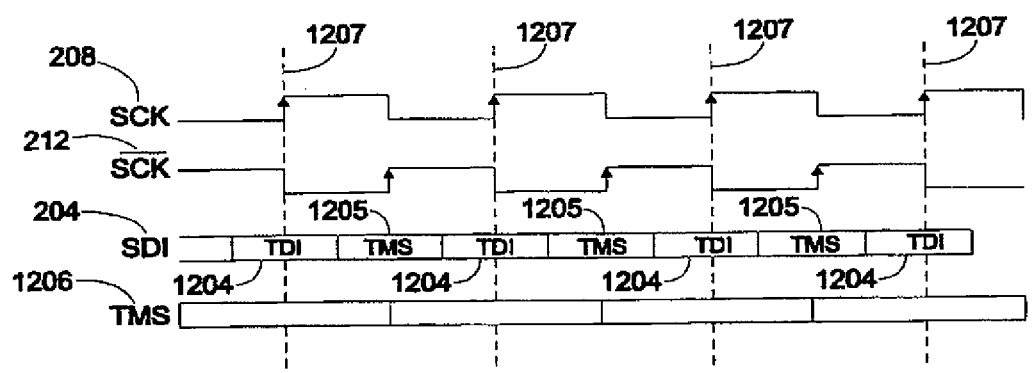
FIG. 12 is a timing diagram showing relative timing of the soft configuration process.

Each module 102, 104, 106 receives the serial communications link 112 by way of an isolator 114. On a module side of the isolator 114, the three lines that make up the serial communications link 112; data in (shown as SDI on FIG. 11) 204, data out (shown as SDO on FIG. 11) 206, and clock (shown as SCK on FIG. 11) 208 are connected to three pins of the module processor 1101. These connections to the module processor 1101 comprise the normal serial communications link 112. In a specific embodiment, the module processor 1101 is a field programmable gate array with JTAG functional capability and hence, a JTAG test port. As one of ordinary skill in the art appreciates, the module processor 1101 may be any logic or processing element capable of performing the process steps described herein. Each line in the serial communications link 112 is also connected to three JTAG pins; TCK 1103, TDI 1104, and TDO 1105, of the JTAG port on the module processor 1101 through serial resistors 1102. An external circuit comprises a D flip-flop 1107 that is clocked from the serial communications clock line 208 with a D input from the data out line 204 and a Q output is connected to a JTAG test mode select (TMS) pin 1110 of the module processor 1101. These four connections to module processor 1101, TCK 1103, TDI 1104, TDO 1105, and TMS 1110 comprise a standard 4-signal JTAG hardware interface or "port". The mainframe controller's serial communications data out signal, one per module, is applied both to a D input 1115 of flip-flop 1107 as SDI 204 and to the TDI input 1104 of the module processor's JTAG port via a resistor 1102. Active clock edges both for flip-flop 1107 and JTAG clock input TCK 1103 are positive transitions. Logic states present at the TDI 1104 and TMS 1110 inputs of the JTAG port of module processor 1101 are therefore both latched or stored on positive transitions of serial communications clock signal SCK 208. Logic inverter 1116 inverts the serial communications clock signal 208, however, before it is applied to the clock input of flip-flop 1107. As a consequence, signal states present on serial communications line SDI 204 are latched into flip-flop 1107 on negative transitions of SCK 208. Therefore signal states present on SDI 204 are latched into flip-flop 1107 and the JTAG boundary scan logic serial input signal line TDI 1104 on opposite edges of serial communications clock SCK 208. The Q output 1117 of flip-flip 1107 is connected to the JTAG TMS input pin 1110 of the module processor 1101. Since the Q output 1117 of flip-flip 1107 changes state on positive transitions of its clock input, it follows that logic state changes at the TMS input 1110 of module processor 1101 occur on negative transitions of serial communications clock SCK 208 and remain constant just prior to, during, and immediately after positive transitions of SCK 208. With specific reference to FIG. 12 and to operation of the serial communications link 112 in JTAG mode, there is shown a trace representing the serial communications clock signal 208 that originates from the controller 100 and an inverted form 212 of the serial communications clock. The serial communications data out signal 204 as received by a module 102, 104, 106 is also shown. At alternating time periods within the serial data stream there are TDI windows 1204 and TMS windows 1205. These windows are of a duration nominally equal to one half the period of SCK 208 and offset in time such that the time boundaries or transitions between alternating windows are at the midpoints of the high and low states of both the true 208 and inverted 212 forms of SCK 208. There is also shown a TMS signal 1206 that corresponds to the Q output 1117 of flip-flop 1107 and also the TMS input 1110 of the JTAG port of module processor 1101. Finally, there are shown time references 1207 corresponding to the rising edge of SCK 208. Noting the functional descriptions previously provided herein with respect to the storage of the state of the serial data stream within flip-flop 1107 as TMS 1205 on positive transitions of the inverted version SCK 212 and also the storage of the logical states of both TDI 1104 and TMS 1110 within the JTAG boundary scan logic on positive edges of SCK 208, it may be seen that the arrangement of TDI and TMS data windows 1204 and 1205 in the serial data stream and the time offset storage action of flip-flop 1107 is such that at each time reference 1207 valid and stable states of both TDI 1104 and TMS 1110 are made available at the JTAG port of the module processor 1101. Stated differently, transmission of TDI 1104 and TMS 1110 information at rates equal to twice the serial clock frequency taken together with the time offsetting action of flip-flop 1107 provides means to de-multiplex two separate information streams from a single serial communications line 204. It is then only necessary for the mainframe controller logic 100 to assemble or multiplex the two information streams in a manner consistent with the de-multiplexing action described herein. In the present embodiment, the necessary multiplexing action is accomplished by means of code operations and the rate of communications constrained to a frequency low enough to ensure that such operations may in fact be conducted in code. Those of ordinary skill in the art will recognize that many alternate, but functionally equivalent, methods may be employed, including ones comprised entirely of hardware, to effect the same multiplexing/de-multiplexing scheme in the context of providing on occasion four-line logical operation across a three-line serial communications link 112.

Returning to FIG. 11, a DONE pin 1108 of the module processor 1101, which is driven by logic within module processor 1101 to signify completion of the bit stream configuration process, is connected to logic bias voltage 1111 through pull-up resistor 1112 and to the preset 1109 of the D flip-flop 1107. The DONE pin 1108 pin floats high unless pulled low by the module processor 1101. Action of the DONE signal is as follows: When the module identification and configuration processes are completed, these two processes normally conducted in a sequence order of identification followed by configuration, logic within module processor 1101 detects completion of configuration as described herein and drives the DONE pin 1108 to a logic high state, pre-setting D flip-flop 1107 and setting TMS 1110 continuously high or true. According to standard JTAG protocols, holding TMS 1110 true for five or more cycles of TCK 1103 places the state machine within the JTAG boundary scan logic into the so-called "test logic reset" state, thereby ending operation in JTAG mode and permitting initiation of normal module processor operations including normal serial communications. On the other hand, following reset of modules 102, 104, 106 and prior to completion of identification and configuration, the DONE signal 1108 is held in a continuous low state, removing the preset input 1109 to flip-flop 1107, and thereby allowing the de-multiplexing actions previously described herein. Once configuration is complete, the DONE signal 1110 is held continuously in the high state and flip-flop 1107 is forced to the preset state thereby preventing re-initiation of JTAG mode of operation regardless of logical states present on the serial communications lines 112. Those of ordinary skill in the art will recognize that signals by other names having similar function with respect to initiation and completion of the identification and configuration processes and to the de-multiplexing actions described herein may be used in alternate realizations to effect transitions into and out of JTAG communications mode as well as operation in JTAG mode.

There are 20 parallel identification lines 1106 sourced by logic distributed throughout the module and input into the module processor 1101 for use as module self-identification. A value on the identification lines 1106 provides a code that uniquely identifies a module and a module feature set. In alternate embodiments, more or fewer lines may be used to uniquely identify a module. The twenty input lines connected to I/O pins of module processor 1101 are read by the mainframe controller 100 using standard JTAG boundary scan test protocols module processor 1101 drives line 206 while the mainframe processor 100 drives lines 204 and 208 via isolator 114. The TMS line 1110 is driven as previously described. The SCK signal 208 drives the TCK JTAG clock pin, the SDI signal 203 drives the TDI JTAG Test Data In pin, while the value of the identification lines 1106 are returned to mainframe controller 100 from the JTAG TDO pin 206. The basic functional behavior of these three signal lines is closely parallel to the functioning of the related serial communications signals when operating in "normal" mode as previously described although, as noted herein, the module processor core logic is not active as would be the case when operating in "normal" serial communications mode. The mainframe controller 100, thus obtains a numerical identification of the module 102, 104, 106. Because the module processor 1101 must be properly powered and minimally functional in order to provide identification, proper receipt by the mainframe controller 100 of the module identification code assumes that the identified module is capable of being configured via the JTAG port using standard JTAG protocols. After the identification phase, the module processor 1101 remains in test mode and the mainframe controller 100 sends a serial configuration bit stream over the serial communications link 112, again using standard JTAG communications protocols. The module processor 100 receives the configuration information through the JTAG lines 1103, 1004, 1105 and 1110 until the module configuration process is complete. The configuration process and information is module dependent and is based upon the identification received by the mainframe controller. Accordingly, the soft configuration process using the JTAG port of each module processor 1101 is flexible and specific to a particular type of module. When the soft configuration process is complete, the module processor 1101 asserts the DONE signal 1108, which presets the D flip flop 1107 as described previously, taking the module processor out of test mode. At this point, the mainframe controller 100 initiates normal serial communications link operations by launching the normal operation serial clock signal onto the clock line 208 and a send data packet onto data out line 204.

The JTAG lines TCK 1103, TDI 1104, TDO 1105, and TMS 1110 are also connected to a separate test pin header 1113 found on the module 102, 104, 106. The test pin header provides access to the JTAG lines TCK 1103, TDI 1104, TDO 1105, and TMS 1110 by a test device such as a logic analyzer during normal communications operations for purposes of development and debug. A user of the system would not normally have access to the test connector, but it is included as part of an improved design for testability and debugging purposes.

Figure 13:
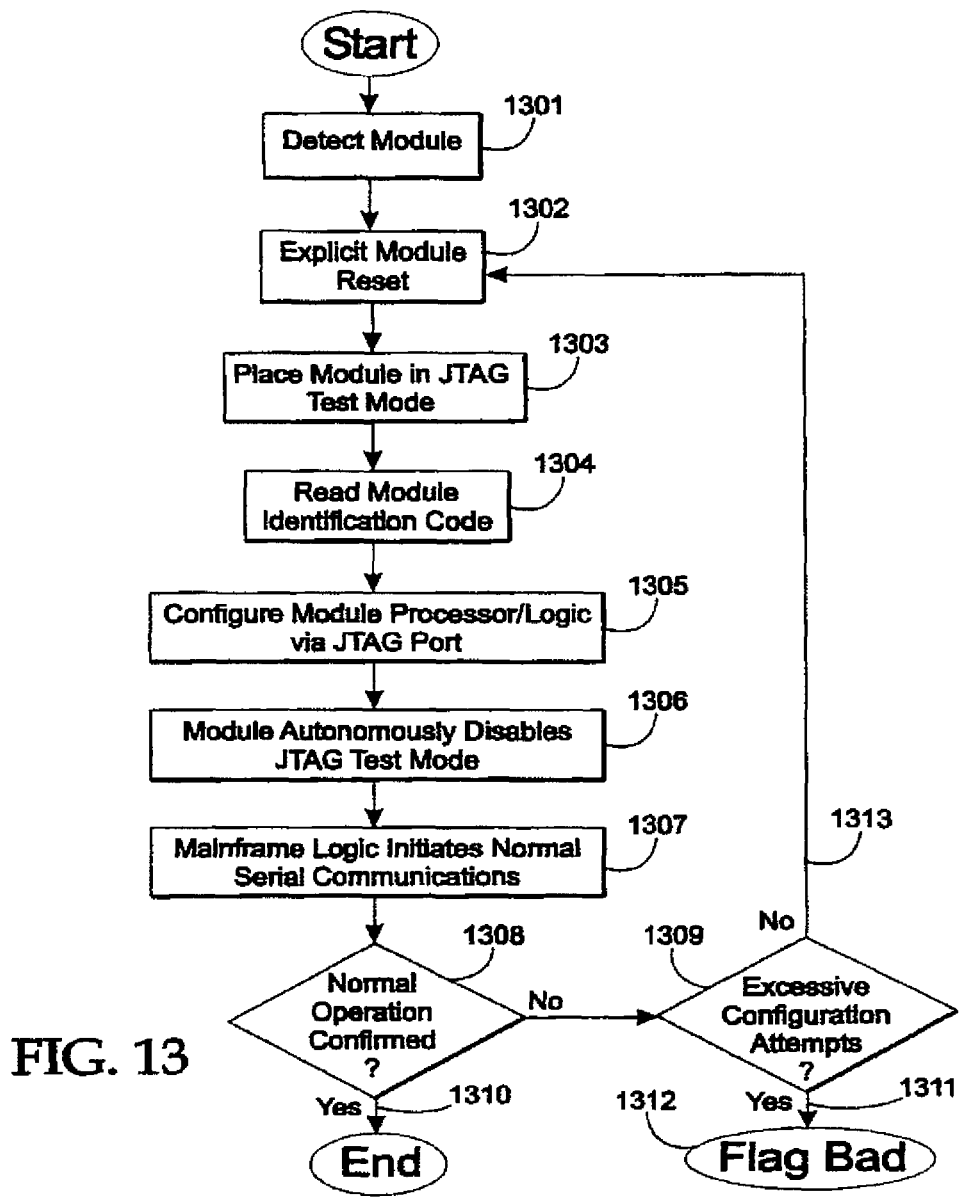
FIG. 13 is a flow chart illustrating steps taken to configure a module after module reset.

With specific reference to FIG. 13 of the drawings, there is shown a simplified flow chart of the module configuration process using the module processor JTAG functionality. After power up of the overall system and following boot-up of the mainframe controller 100 a check for power-good is conducted after which the mainframe controller detects the presence 1301 of one or more modules 102, 104, and 106. For any modules found to be present, the mainframe controller 100 initiates an explicit reset action 1302 by inhibiting serial clock 208 as described previously. For any modules present, the module processor 1101 is then known to be in a reset state, is known to be unconfigured, and therefore is incapable of normal serial communications over the serial communications link 112. Accordingly, the module processor 1101 is immediately placed in a JTAG test mode by asserting the JTAG port signal TMS 1110 and initiating clock activity 1303. The module processor 1101 now operating in JTAG boundary scan mode returns 1304 the module identification code to the mainframe controller 100 whereby the controller 100 is able to identify the necessary module configuration steps for modules 102, 104, 106. The controller 100 then configures 1305 the module processor(s) 1101 by transmitting a serial bit stream using the serial communications link to the JTAG port. When the configuration process is complete, the module processor 1101 autonomously asserts the done signal 1108 to disable the JTAG test mode 1306. Immediately thereafter, the mainframe controller 100 initiates 1307 normal serial communications over the serial communications link 112. Immediately upon initiating normal serial communications, the mainframe controller 100 confirms that modules 102, 104, 106 are responding normally 1308. Detection of normal responses concludes 1310 the detection and configuration process. Failure to detect normal responses from one or more modules 102, 104, 106 results in a test 1309 to determine how many attempts have been made to configure the module(s). If the number of attempts exceeds a pre-determined upper limit 1311 the module or modules failing to respond normally are flagged 1312 as "bad" and the detection and configuration process concludes. If the number of attempts does not exceed the predetermined upper limits 1313 for attempts, a repetition of blocks 1302-1308 is initiated. As understood by one of ordinary skill in the art, various details of the detection and configuration process including the number of configuration attempts may be changed as found to be convenient and appropriate for a specific embodiment. Further, as also well understood by one of ordinary skill in the art, field programmable logic devices need not be configured by means of a serial bit stream using JTAG protocols, but may be configured, for example, by means of ROM devices, micro-controller interfaces, etc. In such cases, the innovative mapping of a four-signal JTAG communications method onto a three-signal serial communications bus as described herein may be solely for the identification process or for other purposes.

The system so described supports at least four different forms of self protect features. As described herein, one self protect feature involves the fast protect bit 412 of the receive data packet 358 and the system fault bit 308 of the send data packet 354. As an example, one or more of the modules 102, 104, 106 may detect an over voltage or over temperature condition. Such a condition typically affects the entire system and warrants a system wide response. Accordingly, the module or modules 102, 104, 106 that detect the condition set the fast protect bit 412 of the receive data packet 358. As also described herein, the mainframe controller 100 receives the fast protect bit 412 and may optionally and selectively set the system fault bit 308 of one or more send data packets 354 within the same communications frame. The modules 102, 104, 106 to which the system fault bit is sent may then respond by inhibiting operation and disabling any module output or other appropriate action while still maintaining system communications.

Another system protect feature involves autonomous reset by any one module 102, 104, 106. In a typical scenario, a power supervisory circuit monitors the module secondary power supplies. If the supervisory circuit detects that one or more of the power supplies is outside of predetermined thresholds, it will place the module processor in a reset condition since faults of this nature typically may result in uncontrolled and undesired behavior. In this condition, the module 102, 104, 106 can no longer communicate over the serial communication link 112. The mainframe controller 100 detects this condition as a failure by the module to respond normally to serial communications activities and may then attempt to soft configure the module using the JTAG port and protocols as previously described herein. If it cannot, the mainframe controller 100 then flags the module 102, 104, 106 as non-operational, as also previously described herein, and continues to communicate with the remaining modules 102, 104, 106. Advantageously, a failure of one module 102, 104, 106 does not require reset of the entire system but does provide notice of such failure.

Figure 14:
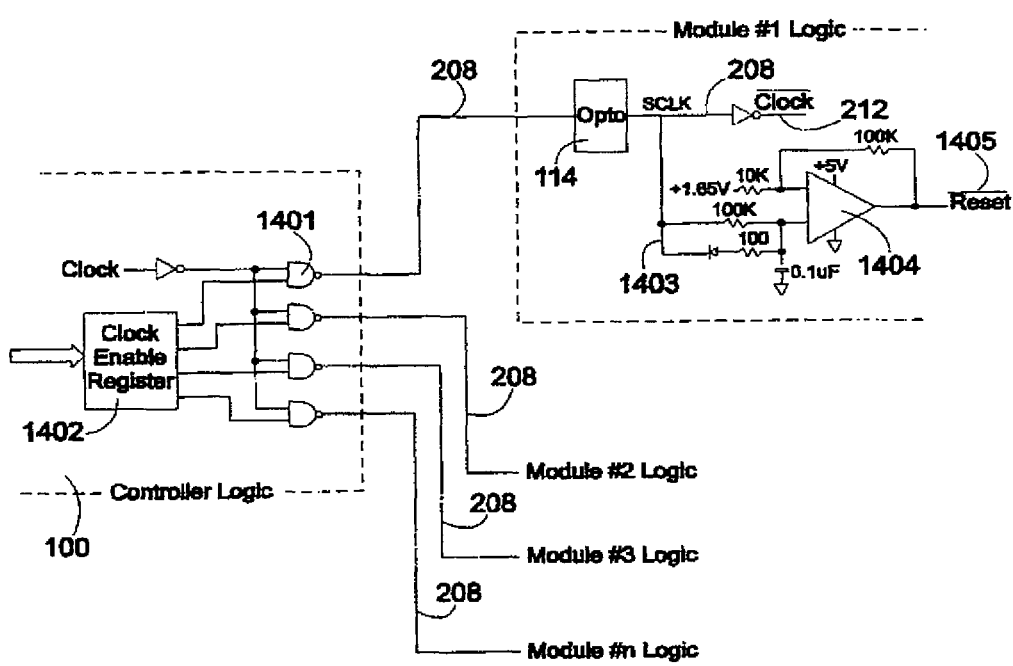
FIG. 14 is a logic diagram for implementation of a selective reset function.

Yet another system protect feature comprises mainframe controller reset of one or more modules by selectively inhibiting the clock signal 208. In this way, it is possible for the mainframe controller to reconfigure one more of the modules 102, 104, 106 without requiring reset and reconfiguration of all of the modules in the system. This reset may be implemented at a system level or a module level as programmed by the mainframe controller 100. With specific reference to FIG. 14 of the drawings, there is shown logic to implement a specific embodiment of selectively inhibiting one or more clock signals 208. The state after reset is a predefined state, typically the "power-up" state, although it is not necessary to adopt this convention. The reset is communicated from the controller 100 to the module 102, 104, 106 by inhibiting the clock signal 208 for a period greater than 10 msec. In a specific embodiment, "inhibiting" the clock signal comprises holding the clock 208 in a logic "1" or "high" state. The selective clock inhibitor circuit comprises a separate clock inhibit NAND gate 1401 for each module's clock line 208. In the disclosed embodiment, holding the clock signal in a logic "0" or "low" state has no effect with respect to resetting modules. A clock enable register 1402 accepts one bit for each module 102, 104, 106, where each bit is an input to each clock inhibit NAND gate 1401. The inverse of the master clock is the other input to each clock inhibit NAND gate 1401. A user can program the clock enable register 1402 to selectively disable one or more of the clocks 208 to selected ones of the modules 102, 104, 106. The module responds by placing the module processor 1101 into a reset state after some number of missed clock cycles. The number of clock cycles is determined using a RC filter 1403 and comparator 1404 circuit. During normal serial communications, the clock 208 is running and continually discharging the RC circuit 1403 to maintain a threshold voltage below a value of approximately 1.65 volts. When the clock signal 208 is inhibited, the NAND gate 1401 holds the clock signal in a "high" state that charges the RC circuit 1403 to a value that eventually exceeds the 1.65 volts. As that occurs, the output of the comparator 1404 connected to a module processor inverted reset 1405, is pulled "low", thereby resetting the module processor 1101. It is preferred that all of the modules 102, 104, 106 respond to the system level reset with similar predefined configurations as well as whatever localized predefined status is appropriate for the each specific module. After reset, either system level or module level, modules 102, 104, 106 that have reset force their respective data in signal lines 206 to a logic "low" or "0" thereby allowing subsequent detection and identification as described above. After the module is reset, the mainframe controller 100 reconfigures the module 102, 104, 106 using the JTAG configuration capability as described herein.

The various fault detection and response modes presented herein provide a flexible and robust response to detected fault conditions while requiring modest use of the serial communications system.

Although embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A method for synchronous triggering of events in a plurality of modules, the method comprising:
   providing each module with a corresponding communications link to a common controller, each communication link comprising a corresponding data out line and a corresponding clock line carrying a corresponding clock signal, wherein all of the clock signals are derived from a single, common, clock source;
   independently selectively enabling and disabling each of the clock signals at the controller;
   transmitting from the controller to a first one of the modules over the corresponding clock line for the first module the corresponding clock signal, and transmitting from the controller to the first module over the corresponding data out tine for the first module a first send packet synchronous with the clock source, wherein the first send packet contains at least one bit position defined as a trigger bit for the first module;
   transmitting from the controller to a second one of the modules over the corresponding clock line for the second module the corresponding clock signal, and transmitting from the controller to the second module over the corresponding data out line for the second module a second send packet synchronous with the clock source, wherein the second send packet contains at least one bit position defined as a trigger bit for the second module;
   triggering an event in the first module upon receipt by the first module of the trigger bit in the first send packet; and
   triggering an event in the second module upon receipt by the second module of the trigger bit in the second send packet.

2. A method as recited in claim 1, wherein the event comprises digitizing a waveform.

3. A method as recited in claim 1, wherein the event comprises synthesizing a waveform.

4. A method as recited in claim 1, wherein each of the communications links further comprises a data in line, the method further comprising:
   receiving at the controller from the first module over the corresponding data in line for the first module a first receive packet synchronous with the dock source, wherein the first receive packet includes at least one bit position defined as a measurement triggered bit for the first module that indicates that a measurement is triggered for the first module; and
   receiving at the controller from the second module over the corresponding data in line for the second module a second receive packet synchronous with the clock source, wherein the second receive packet includes at least one bit position defined as a measurement triggered bit for the second module that indicates that a measurement is triggered for the second module.

5. The method of claim 1, further comprising providing galvanic isolation for each of the communication links between the controller and the corresponding module.

6. The method of claim 1, wherein at least one of the events comprises measuring at least one of a power supply output voltage and a power supply output current.

7. The method of claim 4, further comprising assigning some on the modules to group, wherein first receive packet includes a trigger bit indicating that an event should be triggered in the group of modules.

8. An apparatus, comprising:
a controller including a clock generating circuit for generating a plurality of clock signals and for independently selectively enabling and disabling each of the clock signals, wherein all of the clock signals are synchronized to a single, common, clock source;
a plurality of modules;
a plurality of serial communications links, each serial communications link being connected between the controller and a corresponding one of the modules, each said communications link comprising a data out line and a corresponding one of the clock lines;
means for transmitting a corresponding send packet over each said data out line to each module synchronous with said clock source wherein said send packet contains at least one bit position defined as a trigger bit; and
means in each said module for triggering a module specific event upon receipt of respective ones of said trigger hits.

9. An apparatus as recited in claim 8, wherein one of said events comprises digitizing a waveform.

10. An apparatus as recited in claim 8, wherein one of said events comprises waveform digitization and waveform synthesis on separate channels of said module.

11. An apparatus as recited in claim 8, wherein each of the communication links further comprises a data in line and wherein the controller further comprises means for receiving over said data in line for each communication link a receive packet from said the corresponding module, wherein a predefined bit in each said receive packet comprises an indication that a measurement is -triggered.

12. The apparatus of claim 8, further comprising a plurality of galvanic isolators, each of the communication links including a corresponding one of the galvanic isolators for providing galvanic isolation between the controller and the corresponding module.

13. The apparatus of claim 8, wherein at least one of the modules comprises a programmable power supply.

14. The apparatus of claim 8, wherein at least one of the modules comprises a signal analyzer.

15. The apparatus of claim 8, wherein at least one of the modules comprises a power supply module having first and second waveform generators for control of a power supply output voltage and current, and first and second digitizers for measurement of the power supply output voltage and current.

16. A method for synchronous triggering of events in a plurality of modules, the method comprising:
providing each module with a corresponding communications link to a common controller, each communication link comprising a corresponding data out line, a corresponding data in line, and a corresponding clock line carrying a corresponding clock signal, wherein all of the clock signals are synchronized to a single, common, clock source;
transmitting from the controller to a first one of the modules over the corresponding clock line for the first module the corresponding clock signal, and transmitting to the controller from the first module over the corresponding data in line for the first module a receive packet synchronous with the clock source, wherein the receive packet contains a trigger bit indicating that an event should be triggered in a second one of the modules;
transmitting from the controller to the second module over the corresponding clock line for the second module the corresponding clock signal, and transmitting to the second module over the corresponding data. out line for the second module a. send packet synchronous with the clock source, wherein the send packet contains at least one bit position defined as a. trigger bit indicating that the event should be triggered in the second module; and
triggering the event in the second module upon receipt by the second module of the trigger bit in the send packet; and
independently selectively enabling and disabling each of the clock signals at the controller.

17. The method of claim 16, wherein the event comprises synthesizing a waveform.

18. The method of claim 16, further comprising providing galvanic isolation for each of the communication links between the controller and the corresponding module.

19. The method of claim 16, wherein the event comprises measuring at least one of a power supply output voltage and a power supply output current.

* * * * *

UNITED STATES PATENT AND TRADEMARK OFFICE
CERTIFICATE OF CORRECTION

PATENT NO. : 8,892,791 B2  Page 1 of 1
APPLICATION NO. : 11/873429
DATED : November 18, 2014
INVENTOR(S) : James B. McKim, Jr. et al.

It is certified that error appears in the above-identified patent and that said Letters Patent is hereby corrected as shown below:

Title Page

In (75) Inventors, delete "James P. McKim, Jr." and insert -- James B. McKim, Jr. --, therefor.

In the Claims

In column 24, line 59, In Claim 4, delete "dock" and insert -- clock --, therefor.

In column 25, line 31, In Claim 8, delete "hits." and insert -- bits. --, therefor.

In column 25, line 41, In Claim 11, delete "from said the" and insert -- from the said --, therefor.

In column 25, line 43, In Claim 11, delete "-triggered." and insert -- triggered. --, therefor.

In column 26, line 30, In Claim 16, delete "data." and insert -- data --, therefor.

In column 26, line 31, In Claim 16, delete "module a." and insert -- module a --, therefor.

In column 26, line 33, In Claim 16, delete "as a." and insert -- as a --, therefor.

Signed and Sealed this
Twenty-eighth Day of April, 2015

Michelle K. Lee
*Director of the United States Patent and Trademark Office*